United States Patent [19]

Schreck

[11] Patent Number: 4,750,024
[45] Date of Patent: Jun. 7, 1988

[54] OFFSET FLOATING GATE EPROM MEMORY CELL

[75] Inventor: John F. Schreck, Houston, Tex.

[73] Assignee: Texas Instruments Incorporated, Dallas, Tex.

[21] Appl. No.: 830,160

[22] Filed: Feb. 18, 1986

[51] Int. Cl.$^4$ .................. H01L 29/78; H01L 27/02; H01L 29/04; G11C 11/40

[52] U.S. Cl. .................... 357/23.5; 357/41; 357/54; 357/59; 365/185

[58] Field of Search ............. 357/23.5, 44, 54, 59; 365/185

[56] References Cited

U.S. PATENT DOCUMENTS

| | | | |
|---|---|---|---|
| 4,258,466 | 3/1981 | Kuo et al. | 357/59 J |
| 4,267,632 | 5/1981 | Shappir | 357/23.5 |
| 4,361,847 | 11/1982 | Harari | 357/23 |
| 4,493,057 | 1/1985 | McElroy | 365/182 |
| 4,561,004 | 12/1985 | Kuo et al. | 357/23.5 |
| 4,597,060 | 6/1986 | Mitchell et al. | 357/23.5 |

Primary Examiner—Gene M. Monson
Attorney, Agent, or Firm—John G. Graham; Rodney M. Anderson

[57] ABSTRACT

An electrically programmable read only memory device formed in a face of a semiconductor substrate of a first conductivity type which includes a pair of spaced apart thick oxide isolation regions defining an elongated channel of the substrate therebetween. A floating gate of conductive material overlies a portion of one of the isolation regions and a first portion of the elongated channel being separated from the oxide isolation and channel regions by an insulator layer. A control layer of conductive material extends over the channel and the floating gate separated from both of the latter by an insulator layer. Buried diffused regions are located below each oxide isolation region.

5 Claims, 4 Drawing Sheets

1

OFFSET FLOATING GATE EPROM MEMORY CELL

BACKGROUND

The present invention relates to an electronically programmable read only semiconductor memory cell of a type which is incorporated into an array of such cells formed on a semiconductor chip.

Nonvolatile memory devices offer the significant advantage over volatile memory devices that the information stored is not lost when power is removed. One example of a nonvolatile memory cell is a read only memory cell commonly referred to as a ROM. Information is introduced into a ROM during manufacture using a gate level mask or moat mask as set forth in U.S. Pat. No. 3,541,543 assigned to Texas Instruments. Such ROMS require masks in order to be programmed during manufacture. It is possible to avoid having to program ROM's during manufacture by using in place of ROM's electrically programmable ROM's or EPROMS. Various EPROM's have been developed such as that shown in U.S. Pat. No. 3,984,822 which employs a floating gate in a double level polysilicon MOS ROM. The floating gate is charged by injection of electrons from the channel and stays charged for years.

Electrically alterable ROM's have been developed as set forth in U.S. Pat. No. 3,881,180 issued Apr. 29, 1975, and U.S. Pat. No. 3,882,469 issued May 6, 1975 as well as application Ser. No. 644,982, filed Dec. 29, 1975, all by W. M. Gosney and assigned to Texas Instruments. The Gosney devices are floating gate cells with dual injection (both holes and electrons) so that the gates may be charged or discharged. Another electrically programmable and electrically alterable ROM is disclosed in U.S. Pat. No. 4,493,057 issued on Jan. 8, 1985 to David J. McElroy and assigned to Texas Instruments which uses a buried N+ diffusion region below a field oxide region as a transistor source region in order to reduce capacitive coupling between the source and an overlying column line. U.S. Pat. No. 4,246,592 issued Jan. 20, 1981 to Bartlett and U.S. Pat. No. 4,258,466 issued Mar. 31, 1981 to Kuo et al. and both assigned to Texas Instruments disclose buried diffused source and drain regions with a floating gate extending completely across the source/drain channel. Such devices have limited speed capability given the poor coupling between the second and first levels of polysilicon used for the floating gate and the control gate due to the relatively small ratio of floating gate to control gate area. Extending the edges of the floating gate over the top of the oxide isolation regions on either side of the channel provides an improved coupling between floating and control gates.

Accordingly, it is an object of the present invention to provide an improved electrically programmable read only memory device. Another object is to provide an EPROM having an improved coupling between the floating and control gates. An additional object is to provide an EPROM cell capable of being incorporated into a dense array of such cells.

SUMMARY OF THE INVENTION

According to the invention there is provided an electrically programmable read only memory device formed in a face of a semiconductor substrate of a first conductivity type which includes a pair of spaced apart thick oxide isolation regions defining an elongated channel of the substrate therebetween. A floating gate of conductive material overlies a portion of one of the isolation regions and a first portion of the elongated channel being separated from the oxide isolation and channel regions by an insulator layer. A control layer of conductive material extends over the channel and the floating gate separated from both of the latter by an insulator layer. Buried diffused regions are located below each oxide isolation region.

Preferably, the control layer is self aligned on two sides with the floating gate transverse to the elongated channel.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
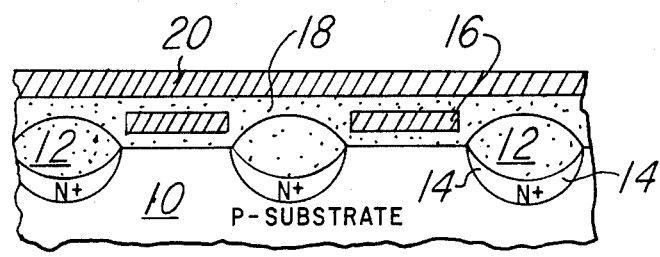
FIG. 1 is a greatly enlarged sectional elevation view of a small portion of a semiconductor chip showing the physical layout of two identical cells of an EPROM array according to the prior art.

Referring to FIG. 1, a pair of EPROM cells is shown made in accordance with the prior art which consists of a plurality of spaced apart, parallel, strips of thermally grown thick oxide strips 12 and buried beneath each strip a heavily doped diffused N+ region 14. Extending over a channel region between each adjacent oxide isolation strip 12 is a floating gate 16 the edges of which are aligned with edges of the oxide strip 12. Overlying the floating gate 16 is a second level control gate layer of polysilicon 20. The floating gate 16 is separated from the substrate 10 and from the control gate by silicon oxide 18.

The coupling between the control gate 20 and floating gate 16 is given by the ratio of the voltage appearing on the floating gate to that applied to the control gate. If $A_2$ is the common area between the floating gate 16 and the control gate 20, $A_s$ is the common area between the substrate 10 and the floating gate 16, $d_1$ is the separation between the substrate channel region and the floating gate and $d_2$ is the separation between the floating gate 16 and the control gate 20 then an approximation to the coupling ratio, R, is given by the following:

$$\frac{A_2}{A_2 + (d_2/d_1)A_s}$$

From the above it is clear that in order to maximize the coupling ratio, R one must make $A_2 >> A_s$ since $d_1$ and $d_2$ are normally set by other considerations. If $d_1$ is 400 Angstroms and $d_2$ is 800 Angstroms then for the structure of FIG. 1, the coupling ratio, R is $\frac{1}{3}$ since $A_2 = A_s$.

Figure 2:
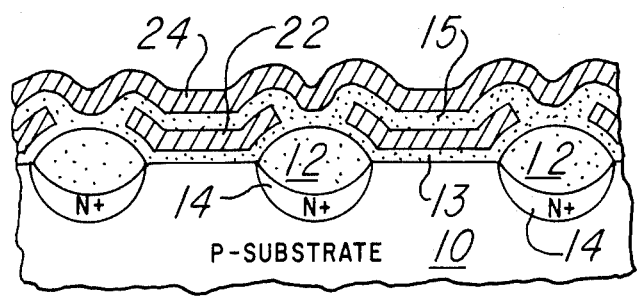
FIG. 2 is a view similar to that of FIG. 1 showing a prior art EPROM design slightly improved over that of FIG. 1.

Referring to FIG. 2, a structure which provides an improved coupling between the second level of polysilicon (the control gate 24) and the first level of polysilicon (the floating gate 22) extends the ends of the floating gate 22 to run over the oxide strips 12 on either side of a cell. A silicon oxide layer 13 of approximately 400 Angstroms separates floating gate 22 from substrate 10 and an oxide layer 15 approximately 800 Angstroms thick separates control gate layer 24 from floating gate 22. If it is assumed that $A_2$ is increased by 50% then for the structure of FIG. 2 the coupling ratio, R, is given by approximately 3/7 for an increase of about 0.17 in the coupling ratio over that of FIG. 1. However, this increase has been at the expense of not keeping to minimum feature sizes such as by cutting down the size of the floating gate 22 to the smallest size achievable.

Figure 3:
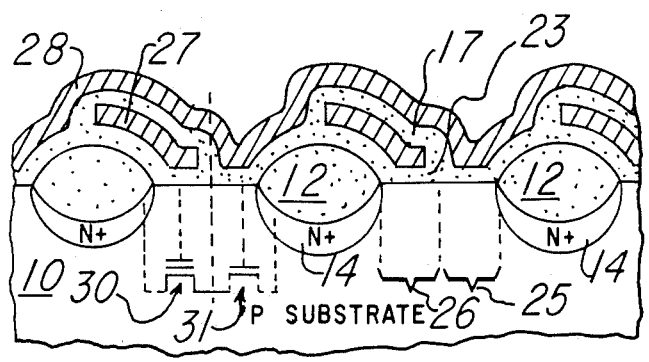
FIG. 3 is a greatly enlarged sectional elevation view of a small portion of a semconductor chip showing the physical layout of two identical cells of an EPROM array according to a preferred embodiment of the present invention.
Figure 4:
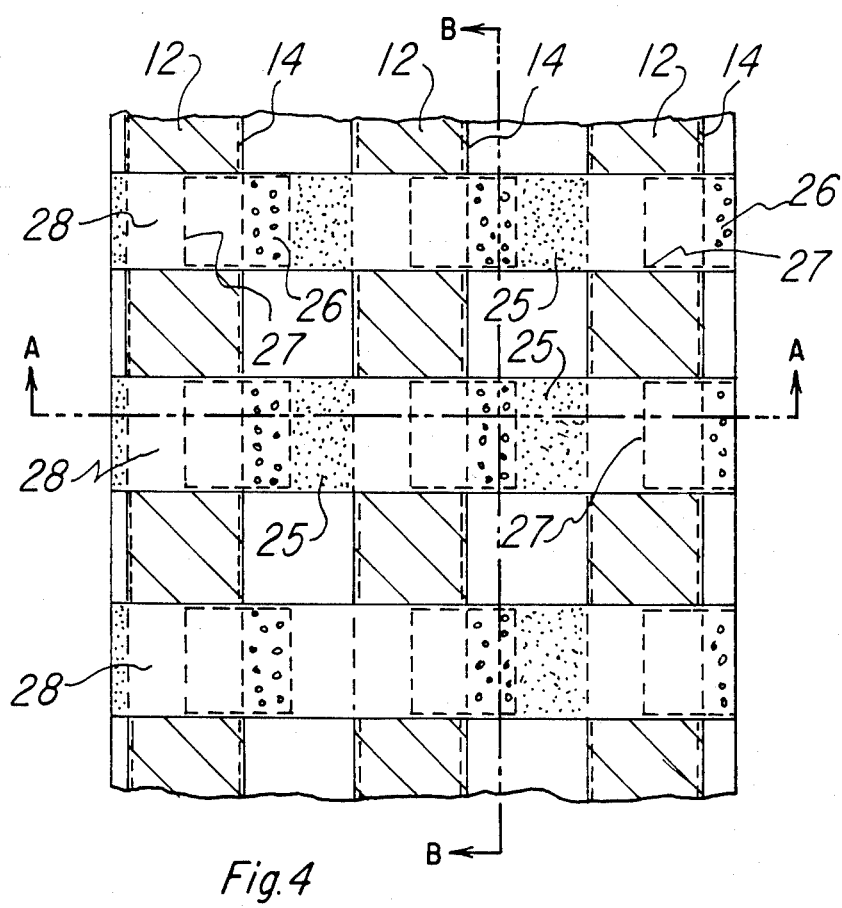
FIG. 4 is a greatly enlarged plan view of the array two cells of which are shown in FIG. 3.

Referring to FIG. 3, an offset floating gate structure similar to that of FIGS. 1 and 2 employs a polysilicon floating gate 27 which extends only partway over a channel region between adjacent oxide isolation strips 12 and approximately halfway over an associated strip adjacent to the channel portion 26 over which the floating gate 27 extends. An overlying polysilicon layer 28 covers the whole region between oxide strips 12 but, as shown in the plan view of FIG. 4, is etched into a plurality of parallel bands with each band contacting a row of cells. The edges of each band are self-aligned with the underlying floating gates. The overlying layer 28 extends down to a region in which its proximate portion 25 of the channel which is contiguous to region 26. An oxide layer 23 of approximately 400 Angstroms thick separates floating gate 27 from the substrate 10 layer 17 of approximately 800 Angstroms thick separates polysilicon layer 28 from the floating gate polysilicon layer 27.

The equivalent circuit of the structure shown in dotted lines consists of a floating gate transistor 30 in series with a field effect transistor 31. The coupling for this structure assuming the common area of overlap of the floating gate 27 and the control layer 28 is 3 times that of the floating gate 27 and the channel region between oxide strips 12 is 3/5 if the same plate separations as for FIGS. 1 and 2 are taken. This coupling ratio is 0.10 higher than that of the device of FIG. 2 and 0.27 higher than that of the device of FIG. 1.

Improved electrical characteristics of the FIG. 3 structure over that of both FIGS. 1 and 2 results from the additional transistor created by the region 25 being covered only by polysilicon layer 28. The latter transistor 31 conducts more current and has better cutoff characteristics than a floating gate device. It will be appreciated that the channel length of floating gate transistor 30 depends on alignment of floating gate 27 with the channel region 26 and 25. Even if the alignment is such as to produce a very short channel transistor 30, the latter transistor 30 when programmed can still restrict current as it is required to do in a programmed state if it drain voltage is kept low.

As seen in FIG. 4, each second level polysilicon control layer 28 is in the form of one of a plurality of parallel spaced apart bands. By etching the floating gate 27 at the same time as the control layer 28 the two opposed edges of each parallel to the length of bands 28 will be aligned with each other. Each band 28 forms one of a series of rows while the source/drains buried, contacts to which are made at an end of each column by any suitable means such as another N+ region diffused into the face of the substrate 10 contiguous to an associated buried diffused N+ region 14 and forming a standard contact to the latter region outside of the region of superposition of bands 28.

Referring now to FIGS. 5 to 10, the process for the fabrication of the device of FIGS. 3 and 4 involves placing a slice (not shown) of P-type monocrystalline silicone, perhaps 3 inches in diameter and 30 mils thick, cut on the <100> plane, of P-type conductivity doped with boron in growing to a resistivity of about 6 to 8 ohm-cm. In the Figures the wafer or body 11 represents a very small part of the slice, chosen as a representative sample cross sections.

Figure 5:
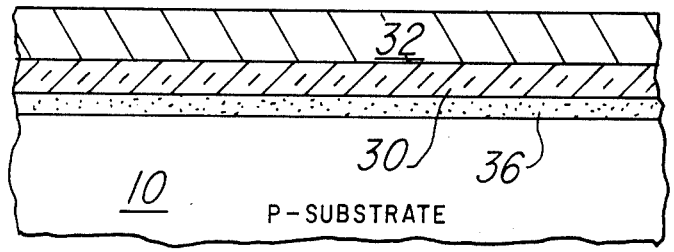
FIGS. 5–10 are sectional elevation views such as that of FIG. 3 showing various stages in the manufacture of the device taken along line AA of FIG. 4.
Figure 6:
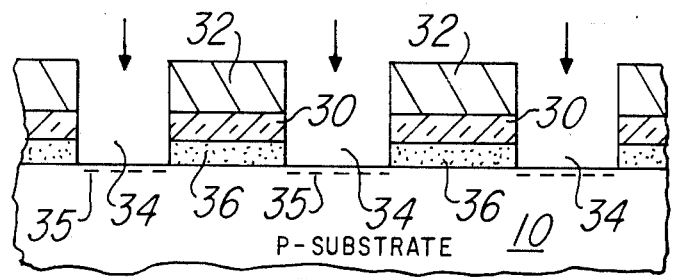
Figure 7:
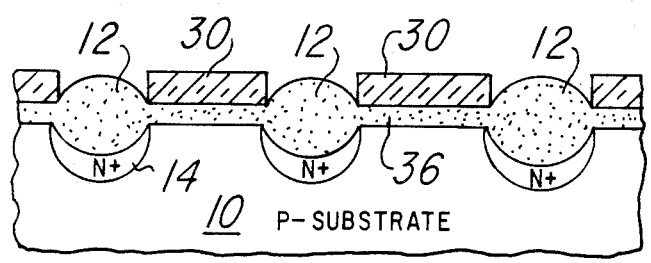

After appropriate cleaning the slice is oxidized by exposing it to oxygen in a furnace at an elevated temperature of about 1000° C. sufficiently long to grow an oxide layer 36 to a thickness of about 1000 angstroms as shown in FIG. 5. Next a layer 30 of silicon nitride is formed by exposing the slice to an atmosphere of silane and ammonia in an rf reactor. This nitride layer 30 is grown to a thickness of about 1,000 angstroms. Finally, a layer 32 of photoresist is deposited over the silicon nitride layer 30 and patterned so as to leave elongated strips of open areas where nitride is to be etched away. The slice is then subjected to an etch sequence, which removes the part of the nitride layer 30 not covered by photoresist as well as the underlying oxide of oxide layer 36 in open regions 34 as shown in FIG. 6. Arsenic is implanted in open regions 34 creating regions 35 in the silicon substrate. Field oxide 12 is next grown by subjecting the slice to steam or an oxidizing atmosphere at about 900° C. for perhaps 10 hours or so. The implanted arsenic diffuses ahead of the oxidation front to create the diffusion source/drain regions 14 as shown in FIG. 7 which underlie the oxide isolation strips 12.

Figure 8:
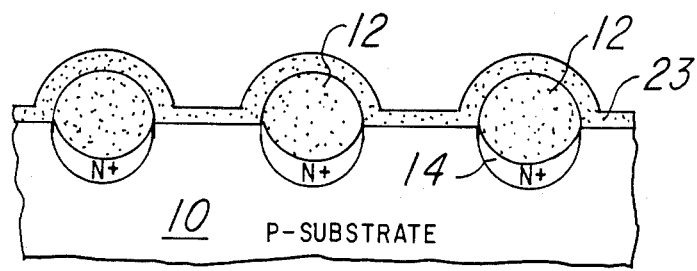

The nitride layer 30 is now removed by an etchant which attacks nitride but not silicon or silicon dioxide. Next the slice is again subjected to either steam or an oxidizing atmsophere at about 900° C. to grow the oxide layer 23 to a thickness of about 400 angstoms as seen in FIG. 8. A layer of polycrystalline silicon is deposited over the entire slice in a reactor using standard techniques, for example by decomposition of silane in hydrogen at about 930° C. to a thickness of about one-half micron. The layer of polysilicon is subjected to a phosphorus deposition and diffusion to render it highly conductive. The diffusion does not penetrate the substrate 10.

Figure 9:
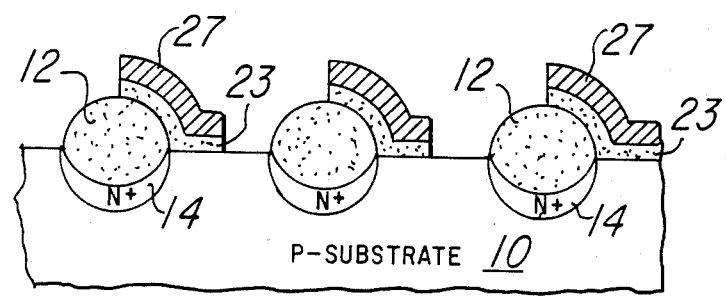
Figure 10:
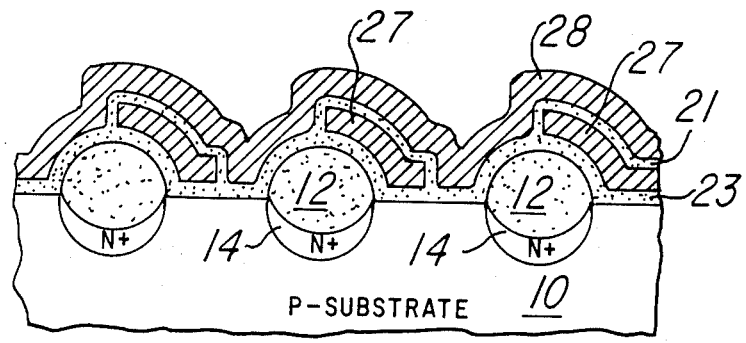
Figure 11:
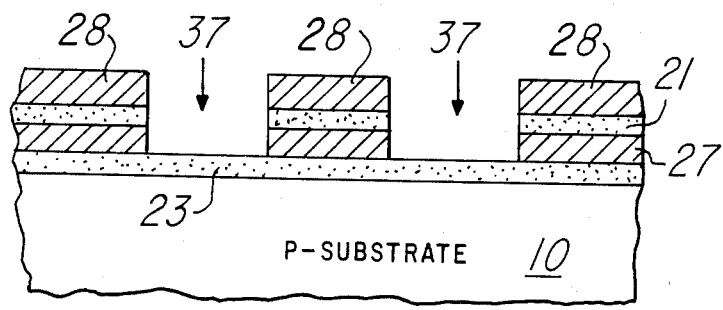
FIG. 11 is a sectional elevation view taken along the line BB of FIG. 4.

A layer of photoresist (not shown) is deposited over the surface, patterned and etched to leave the floating gate polysilicon 27 and silicon dioxide 23 as seen in FIG. 9. A layer of interlevel oxide 21 is then grown on the tops and sides of the polysilicon 27 and silicon substrate 10 at an elevated temperature of about 900° C. in oxygen for about $\frac{1}{2}$ hour. Another layer of polycrystalline silicon 28 is deposited over the entire slice and doped as explained above. Finally, a layer of photoresist, (not shown) is deposited and patterned so as to leave open strip-like areas above regions 37. The polycrystalline silicon layers 27 and 28 and the oxide layer 21 is etched to leave open strips 37 between the rows of cells.

The field oxide 12 functions to minimize the capacitance between the buried diffusion source/drain regions 14 and the row lines 28.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electronically programmable read only memory cell formed in a face of a semiconductor substrate of a first conductivity type, comprising:
   a pair of spaced apart thick oxide isolation regions defining an elongated channel of said substrate therebetween;
   a floating gate of conductive material having a predetermined length, overlying a portion of one of said isolation regions and a first portion of said elongated channel, and separated from said channel by a thin insulator layer, wherein at least approximately one half of said predetermined length of said floating gate overlies said portion of one of said isolation regions;
   a control layer of conductive material extending over said floating gate and over a portion of said channel not overlied by said floating gate, and separated from said floating gate and said channel by an insulator layer; and
   a buried diffusion region of a second conductivity type formed below said isolation regions;
   wherein the sides of said floating gate which define its width transverse to said channel are self-aligned with said control layer.

2. A device according to claim 1, wherein said substrate is P-type conductivity material and said buried diffusion regions are heavily doped $N^+$ type conductivity material.

3. A device according to claim 2, wherein said floating gate and control layers are polysilicon.

4. A device according to claim 2, wherein said oxide isolation regions are silicon dioxide thermally grown in parallel strips.

5. A device according to claim 4, wherein said heavily doped $N^+$ type buried diffusion regions are formed by implanting said face in the areas where said isolation regions are to be grown with arsenic and then growing said isolation regions such that the diffusion regions are formed in advance of said isolation regions.

* * * * *